(12) United States Patent
Wirbeleit

(10) Patent No.: US 8,183,096 B2
(45) Date of Patent: May 22, 2012

(54) STATIC RAM CELL DESIGN AND MULTI-CONTACT REGIME FOR CONNECTING DOUBLE CHANNEL TRANSISTORS

(75) Inventor: Frank Wirbeleit, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 440 days.

(21) Appl. No.: 12/507,879

(22) Filed: Jul. 23, 2009

(65) Prior Publication Data

US 2010/0052069 A1 Mar. 4, 2010

(30) Foreign Application Priority Data

Aug. 29, 2008 (DE) .................. 10 2008 045 037

(51) Int. Cl.
*H01L 21/335* (2006.01)
*H01L 21/8232* (2006.01)

(52) U.S. Cl. ........ 438/142; 438/174; 438/289; 438/197; 438/207; 438/217; 257/287; 257/192; 257/202

(58) Field of Classification Search ............... 438/289, 438/142, 174, 197, 207, 217, 241; 257/202, 257/192, 287

See application file for complete search history.

(56) References Cited

U.S. PATENT DOCUMENTS

| | | | | |
|---|---|---|---|---|
| 4,145,233 | A | 3/1979 | Sefick et al. | 148/1.5 |
| 6,624,459 | B1 | 9/2003 | Dachtera et al. | 257/296 |
| 6,960,507 | B2 * | 11/2005 | Kim et al. | 438/270 |
| 7,262,462 | B2 * | 8/2007 | Kim et al. | 257/335 |
| 7,442,971 | B2 * | 10/2008 | Wirbeleit et al. | 257/287 |
| 7,880,239 | B2 * | 2/2011 | Wirbeleit | 257/393 |
| 2004/0228160 | A1 | 11/2004 | Chan et al. | 365/154 |
| 2005/0082613 | A1 | 4/2005 | Taguchi | 257/347 |
| 2006/0278893 | A1 | 12/2006 | Letavic | 257/197 |
| 2007/0176246 | A1 * | 8/2007 | Wirbeleit et al. | 257/404 |
| 2009/0026521 | A1 * | 1/2009 | Wirbeleit et al. | 257/314 |
| 2009/0194824 | A1 * | 8/2009 | Wirbeleit | 257/393 |
| 2009/0321835 | A1 * | 12/2009 | Wirbeleit | 257/365 |
| 2009/0321836 | A1 * | 12/2009 | Wei et al. | 257/365 |

FOREIGN PATENT DOCUMENTS

DE 102004037087 A1 3/2006
WO WO 2007/122565 A2 11/2007

OTHER PUBLICATIONS

PCT Search Report and Written Opinion from PCT/EP2009/006263 dated Nov. 17, 2009.
Translation of Official Communication from German Patent Office for German Patent Application No. 10 2008 045 037.5-33 dated May 13, 2009.

* cited by examiner

*Primary Examiner* — Telly Green
(74) *Attorney, Agent, or Firm* — Williams, Morgan & Amerson

(57) ABSTRACT

A static RAM cell may be formed on the basis of two double channel transistors and a select transistor, wherein a body contact may be positioned laterally between the two double channel transistors in the form of a dummy gate electrode structure, while a further rectangular contact may connect the gate electrodes, the source regions and the body contact, thereby establishing a conductive path to the body regions of the transistors. Hence, compared to conventional body contacts, a very space-efficient configuration may be established so that bit density in static RAM cells may be significantly increased.

6 Claims, 9 Drawing Sheets

STATIC RAM CELL DESIGN AND MULTI-CONTACT REGIME FOR CONNECTING DOUBLE CHANNEL TRANSISTORS

BACKGROUND OF THE INVENTION

1. Field of the Invention

The present disclosure generally relates to the fabrication of integrated circuits, and, more particularly, to transistor architectures that enable an extended functionality of transistor devices, thereby providing the potential for forming static RAM cells and the like in a space-efficient manner.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in redesigning process techniques and developing new process strategies and tools to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which may influence, upon application of an appropriate control voltage, the conductivity of a channel region formed between a drain terminal and a source terminal.

On the basis of field effect transistors, more complex circuit components may be created. For instance, storage elements in the form of registers, static RAM (random access memory) and dynamic RAM cells represent an important component of complex logic circuitries. For example, during the operation of complex CPU cores, a large amount of data has to be temporarily stored and retrieved, wherein the operating speed and the capacity of the storage elements significantly influence the overall performance of the CPU. Depending on the memory hierarchy used in a complex integrated circuit, different types of memory elements are used. For instance, registers and static RAM cells are typically used in the CPU core, due to their superior access time, while dynamic RAM elements are preferably used as working memory, due to the increased bit density compared to registers or static RAM cells. In other applications, extended static RAM devices are frequently used in an increasing variety of electronic devices, wherein demands with respect to low power consumption and high information storage density are also to be met by these static RAM devices. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of DRAM devices may be very high, a charge has to be transferred from and to storage capacitors in combination with periodic refresh pulses, thereby rendering these devices less efficient in terms of speed and power consumption when compared to static RAM cells. On the other hand, static RAM cells require a plurality of transistor elements to allow the storage of an information bit.

In order to reduce the number of transistor elements in static RAM cells, it has, therefore, been proposed to use field effect transistors with increased functionality compared to conventional field effect transistors by providing a modified body region of the field effect transistors on the basis of an additional doped region to provide a "second" channel region, which may impart a different transistor characteristic to these so-called double channel field effect transistors. That is, by providing an additional second channel region in the body of the planar field effect transistor, the trans-conductance of the transistor may be modified to generate a local maximum of the drain source current, thereby obtaining a three-state transfer slope, which may be used for providing basic transistor circuits with increased functionality. For instance, in conventional transistor architectures, a RAM cell with a reduced number of transistors may be provided.

FIG. 1a schematically illustrates a cross-sectional view of a conventional transistor element 100 that may be used in forming an electronic circuit, such as a RAM cell with enhanced functionality or with a reduced number of circuit elements compared to conventional strategies by taking advantage of the three-state transistor transfer slope. The transistor element 100 comprises a substrate 101, which may be any appropriate substrate, such as a bulk semiconductor substrate, an insulating substrate having formed thereon a crystalline semiconductor layer and the like. For example, the substrate 101 may represent a bulk silicon substrate or a silicon-on-insulator (SOI) substrate, since presently, and in the near future, the majority of complex integrated circuits are and will be fabricated on the basis of silicon. A substantially crystalline semiconductor region 102 is formed on the substrate 101 and comprises a specified dopant material to provide a desired conductivity type of the region 102. In the example shown in FIG. 1a, the semiconductor region 102 is doped to provide a P-type conductivity. Furthermore, drain and source regions 104 are formed adjacent to the region 102 and include a dopant material that imparts a conductivity type to the drain and source regions 104 that is opposite to the conductivity type of the semiconductor region 102. In the example shown, the drain and source regions 104 are heavily doped so that corresponding PN junctions are formed along interfaces between the drain and source regions 104 and the semiconductor region 102. Moreover, a channel region 103 is located between the drain and source regions 104 according to typical planar transistor configurations and comprises a first channel sub-region 103A that is oppositely doped with respect to the drain and source regions 104. For example, the first channel sub-region 103A may be considered as a "conventional" channel region of a conventional enhancement transistor. Furthermore, the channel region 103 comprises a second channel sub-region 103B that is oppositely doped with respect to the first channel sub-region 103A and may therefore be considered as a "depletion" channel. In the example shown, the planar field effect transistor 100 of FIG. 1a represents an N-type transistor and, therefore, the first channel sub-region 103A is P-doped and the second channel sub-region 103B is N-doped. The transistor element 100 further comprises a gate electrode 105 that is located above the channel region 103, i.e., above the first and second channel sub-regions 103A, 103B, thereby enabling a capacitive coupling of the gate electrode 105 to the channel region 103. Furthermore, in the example shown, the gate electrode 105 is separated from the channel region 103 by a gate insulation layer 106 formed on the top surface of the basic semiconductor layer in which the drain and source regions 104 and the channel region 103 are provided. The gate insulation layer 106 may be comprised of silicon dioxide and/or silicon nitride and/or silicon oxynitride and/or high-k dielectric materials and the like, according to well-established transistor architectures. The transistor element 100, which may also be referred to as a double channel transistor due to the configuration of the channel region 103, further comprises sidewall spacers 107 formed on sidewalls of the gate electrode 105 in accordance with well-established transistor configurations. Furthermore, other components, such as metal silicide regions in the drain and source regions 104 and the gate electrode 105 may be provided to enhance overall conductivity and thus transistor performance. For convenience, any such performance-enhancing components are not illustrated. In some conventional approaches for forming a double channel transistor, a contact area 108 is provided that connects to a portion of the semiconductor region 102, which, in combination with the channel region 103, may also be referred to as the body region of the transistor 100. The contact area 108 is thus electrically connected to the body region while at the same time being electrically isolated from the drain or the source region 104 by the corresponding PN junctions. By means of the contact area 108, the body region of the transistor 100 may be connected to an appropriate reference voltage, which may enhance the controllability of the transistor 100.

The transistor 100 may be formed on the basis of well-established conventional transistor manufacturing process flows, including the fabrication of appropriate isolation structures (not shown) in order to define respective active areas for a plurality of transistors, such as the transistor 100. Next, the basic doping of the body region of the transistor may be established by well-established implantation techniques, followed by the incorporation of an opposite dopant species in order to define the second channel sub-region 103B within the body region. Next, the gate electrode 105, in combination with the gate insulation layer 106, may be formed, for instance, by forming the gate dielectric material by oxidation and/or deposition followed by the deposition of an appropriate gate electrode material, such as polysilicon and the like, which may subsequently be patterned on the basis of sophisticated lithography techniques. Thereafter, an offset spacer (not shown) may be formed, if required, and an implantation sequence may be performed to define a first portion of the drain and source regions 104, which may also include a corresponding halo implantation process. That is, during the halo implantation, a conductivity type may be induced, for instance, on the basis of a tilted implantation process, which is of opposite conductivity type compared to that obtained by the dopant species for the drain and source regions. Consequently, in addition to adjusting the dopant gradient at the PN junctions, the second channel sub-region 103B may also be "isolated" from the drain and source regions due to the counter doping obtained by the halo implantation, which may result in a higher dopant concentration at the areas between the second channel sub-region 103B and the drain and source regions so as to impart an overall conductivity to these areas that corresponds to the conductivity type of the remaining body region. Thereafter, the spacer structure 107 may be formed in accordance with well-established spacer techniques. The drain and source regions 104 may be completed by respective ion implantation processes, followed by appropriately designed anneal cycles in order to activate the dopant species and re-crystallize implantation-induced damage, thereby also adjusting the final dopant profile.

FIG. 1b schematically illustrates the functional behavior of the double channel transistor 100. In FIG. 1b, the conductivity of the transistor 100, i.e., the conductivity of the channel region 103, is plotted along the vertical axis in arbitrary units, and the control voltage $V_G$ supplied to the gate electrode 105 is shown on the horizontal axis. The double channel transistor 100 exhibits a significantly modified trans-conductance compared to conventional single channel planar field effect transistors due to the presence of the second channel region in that the conductivity of the transistor 100 has a more or less pronounced local maximum. As illustrated, when the control voltage $V_G$ exceeds a first threshold voltage $V_{T1}$, a typical increase of the conductivity may be obtained as the case for conventional planar enhancement transistors. At a second threshold voltage $V_{T2}$, however, a significant drop of the conductivity with increasing control voltage $V_G$ may be observed, resulting in a local minimum at a third threshold voltage $V_{T3}$ at which a further increase in conductivity with an increasing control voltage $V_G$ may be observed. Consequently, the local maximum or minimum at voltages $V_{T2}$ and $V_{T3}$, respectively, may provide an intermediate stable state in the transfer slope of the transistor 100, which may be advantageously used in order to build basic electronic circuits of increased functionality for the same number of circuit elements as in conventional designs, while, in other cases, a desired functionality may be accomplished on the basis of a reduced number of circuit elements by replacing one or more of the conventional planar field effect transistors by a planar double channel transistor, such as the transistor 100.

However, in view of increasing information density or general packing density in sophisticated semiconductor devices, the area consumption of the corresponding transistor devices is of higher importance than the number of circuit elements that is required for obtaining the desired electrical performance. That is, although the number of transistor elements may be reduced, for instance in static RAM cells, by replacing two or more of the transistors with double channel transistors, as described with reference to FIGS. 1a-1b, the semiconductor area required for providing these double channel transistors may not necessarily be less compared to a conventional circuit layout in which, for instance, six transistors may be used for a typical static RAM cell. This difference in area consumption may be caused by the requirement of body contacts, such as the contact 108 of FIG. 1a, which may be realized in conventional strategies by T-shaped or H-shaped gate electrode structures, which may consume valuable areas of the respective active region, as will be described with reference to FIG. 1c in more detail.

FIG. 1c schematically illustrates a top view of a double channel transistor, such as the double channel transistor 100 as shown in FIG. 1a. In this configuration, the transistor 100 may comprise an active region 110, which is to be understood as a continuous semiconductor region enclosed by an isolation structure, such as a shallow trench isolation 111 and the like. Thus, the active region 110 may therefore represent a single semiconductor region without any intermediate isolation structures, in which an appropriate dopant profile may be established, which may be accomplished on the basis of different dopant species, as is required for forming respective PN junctions and the like, in accordance with the overall required configuration. Moreover, the gate electrode structure 105 is formed above a portion of the active region 110, thereby defining a drain region 104D and a source region 104S, which may have an appropriate dopant concentration, as previously explained. It should further be appreciated that, below the gate electrode structure 105, a corresponding channel region including two "channels" may be provided, as previously explained with reference to FIG. 1a. Moreover, the gate electrode structure 105 may comprise a respective portion 105A, which may act as a contact area of the gate electrode 105 and below which a semiconductor region may exist, which may connect to the body region of the transistor 100. Furthermore, a portion of the active region 110 may act as the body contact 108, which may connect to the area positioned below the contact area 105A of the gate electrode 105. Furthermore, respective contact elements 128, 129 and 130 may be provided to establish the respective electrical connections to a metallization system to be provided above the transistor 100. For example, the contact element 128 may connect to the body contact 108 and may also connect to a metal line (not shown) of the first metallization layer, which may also connect to the contact element 130, if a direct electrical connection between the gate electrode 105, the source region 104S and the body contact 108 is required. On the other hand, the source region 104S may be directly connected to the gate electrode 105 via the "rectangular" contact element 130. Similarly, the contact element 129 may be provided so as to connect to the drain region 104D and a corresponding metal line of the metallization system.

Typically, the transistor 100 may be formed in accordance with manufacturing techniques as are also described with reference to FIG. 1a, wherein, after completing the basic transistor configuration, the corresponding contact elements 128, 129 and 130 may be formed in an interlayer dielectric material on the basis of well-established patterning strategies, wherein these contact elements may be formed in a common process sequence. Thereafter, one or more respective metallization levels may be formed in order to provide the metallization system in accordance with device requirements. Thus, as is evident from FIG. 1c, a significant die area may be required for forming the transistor 100 including the body contact 108 so that, for a static RAM cell, which may include two or more double channel transistors, the required silicon area may be comparable or even higher compared to a conventional static RAM cell including six conventional single channel transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and appropriate layouts for forming the same on the basis of double channel transistors including body contacts, which may be accomplished in a highly space-efficient manner. For this purpose, an appropriate body contact structure may be laterally positioned between two adjacent double channel transistors such that the body contact may connect to both body regions, while also providing electrical connection between source regions, gate electrodes and the body regions such that the body regions may be connected with appropriate low resistivity. To this end, according to some illustrative aspects disclosed herein, a single contact element may be provided to concurrently connect to gate electrode structures and source regions of the double channel transistors while at the same time connecting to the body contact. A corresponding arrangement may, in some illustrative embodiments, be efficiently applied to a static RAM cell, which may be comprised of two double channel transistors and a further select transistor, thereby obtaining a significantly reduced area compared to conventional static RAM cells. Thus, information density of static RAM devices may be significantly increased while not significantly contributing to overall process complexity.

One illustrative memory cell disclosed herein comprises a P-type double channel transistor comprising a first gate electrode formed above an active region. The memory cell further comprises an N-type double channel transistor comprising a second gate electrode formed above the active region. Furthermore, a dummy gate electrode is formed above the active region and is laterally positioned between the first gate electrode structure and the second gate electrode structure. Additionally, an interlayer dielectric material is formed above the P-type and N-type double channel transistors and a contact element is formed in the interlayer dielectric material, wherein the contact element connects to at least the first and second gate electrodes and the dummy gate electrode.

One illustrative semiconductor device disclosed herein comprises a first double channel transistor comprising a first gate electrode and a first body region. The semiconductor device further comprises a second double channel transistor comprising a second gate electrode and a second body region. Furthermore, a body contact is positioned laterally between the first and second double channel transistors, wherein the body contact connects to the first and second body regions. Finally, the semiconductor device comprises a single contact element formed in an interlayer dielectric material, wherein the contact element connects to the body contact, the first and second gate electrodes and source regions of the first and second double channel transistors.

One illustrative method disclosed herein comprises forming a body contact above an active region and laterally between a first double channel transistor and a second double channel transistor. Furthermore, an interlayer dielectric material is formed above the body contact and the first and second double channel transistors. Finally, the method comprises forming a contact element in the interlayer dielectric material so as to connect to a first gate electrode and a source region of the first double channel transistor, a second gate electrode and a source region of the second double channel transistor and the body contact.

BRIEF DESCRIPTION OF THE DRAWINGS

The disclosure may be understood by reference to the following description taken in conjunction with the accompanying drawings, in which like reference numerals identify like elements, and in which.

Figure 1A:
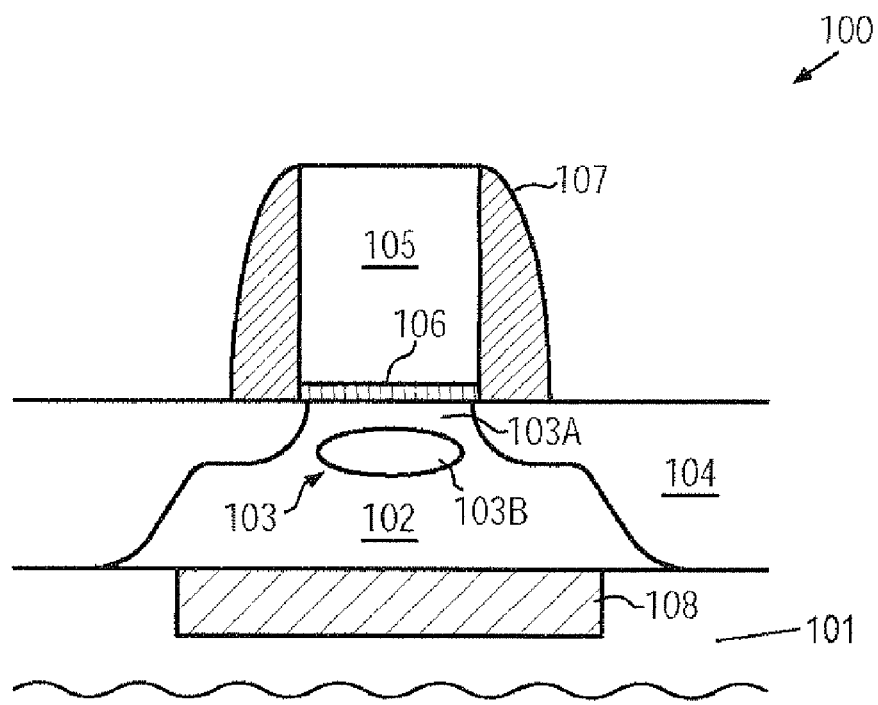
FIG. 1a schematically illustrates a cross-sectional view of a double channel field effect transistor including a second channel region in the body, according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to semiconductor devices and corresponding layouts and methods in which a body region of double channel transistors may be efficiently connected to gate electrodes and source regions of the double channel transistors on the basis of a single contact element, thereby providing reduced space consumption compared to conventional techniques for forming body contacts. In some illustrative embodiments, the space-efficient contact regime for the body contacts of two or more double channel transistors may be applied to a static RAM cell, which, in one illustrative embodiment, may be comprised of two double channel transistors in combination with a select transistor, wherein reduction of area consumption of approximately 50 percent, compared to conventional static RAM cells formed on the basis of the same technology node, may be accomplished. Consequently, due to the increased functionality of double channel transistors including body contacts, the number of transistor elements may be reduced, while also the area consumption of these transistors may be maintained at a lower level due to the space-efficient electrical connection between the bodies and the transistor areas, such as the source regions and the gate electrode structures.

It should be appreciated that the principles disclosed herein may be advantageously applied to static RAM memory cells, since the space-efficient configuration thereof may provide enhanced information density compared to conventional techniques, thereby enabling the production of memory devices of increased information density and also the incorporation of increased storage into complex circuitry, such as CPUs and the like. On the other hand, the present disclosure may also be applied to other circuit configurations, in which two or more double channel transistors are to be used to replace conventional single channel transistors in order to increase overall functionality of circuits, while at the same time providing increased packing density. Thus, the present disclosure should not be considered as being restricted to specific electronic circuits unless such restrictions are specifically set forth in the specification or the appended claims.

Figure 1B:
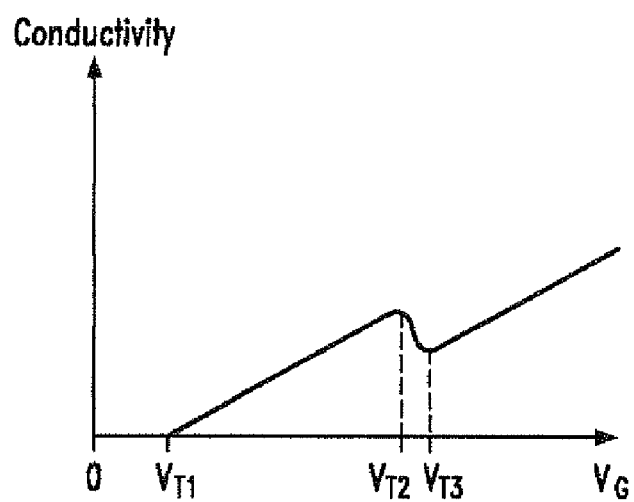
FIG. 1b schematically illustrates a three-state behavior of a double channel field effect transistor, which may be used in forming circuits, such as memory cells having a reduced number of transistor elements.
Figure 1C:
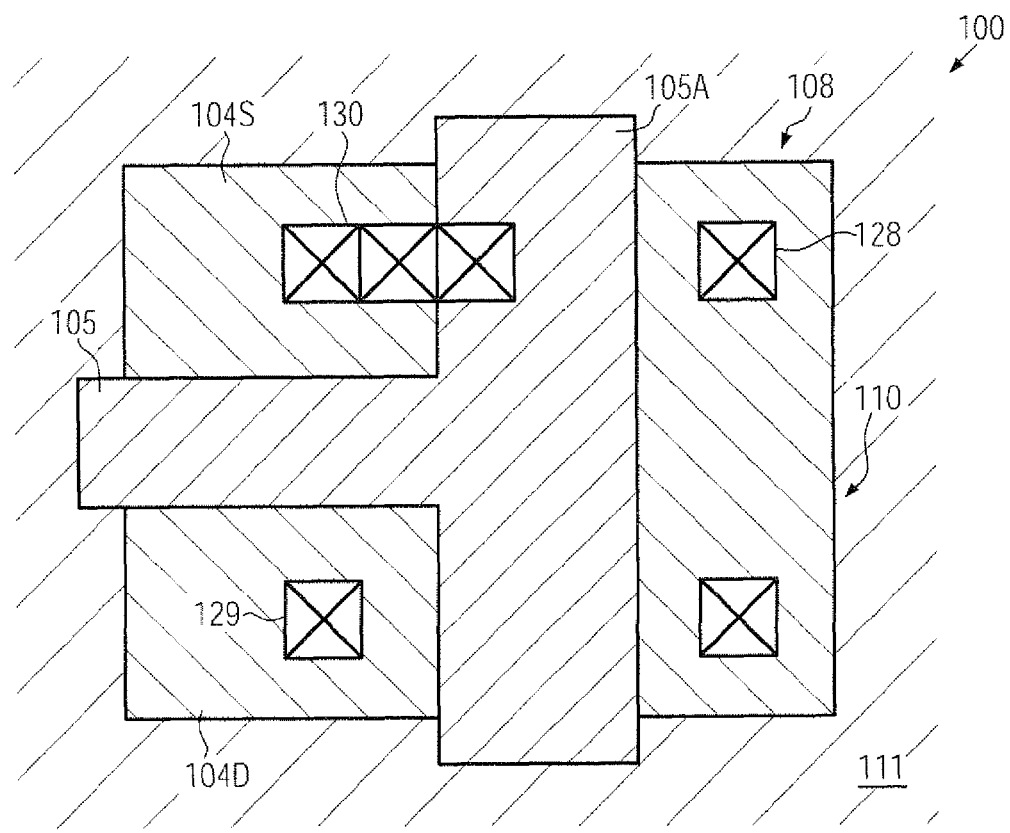
FIG. 1c schematically illustrates a top view of a double channel transistor including a body contact formed on the basis of conventional techniques.

With reference to FIGS. 2a-2g, further illustrative embodiments will now be described in more detail, wherein reference may also be made to FIGS. 1a-1c, if appropriate.

Figure 2A:
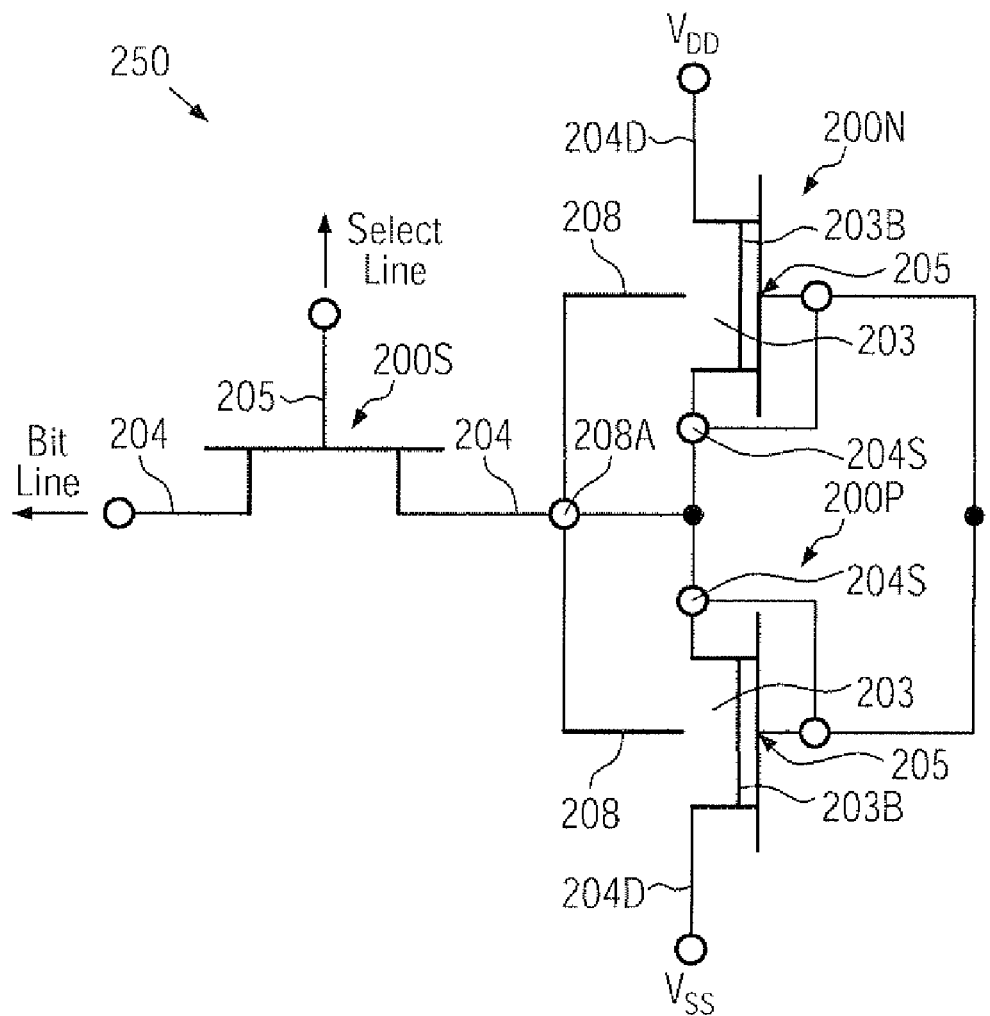
FIG. 2a schematically illustrates a circuit diagram of a static RAM cell including two double channel transistors and a select transistor, which may provided in the form of a "single" channel transistor, according to illustrative embodiments.

FIG. 2a schematically illustrates a circuit diagram of an electronic circuit 250 which represents a memory cell for storing one bit of information. The memory cell 250 may be based on a reduced number of transistor elements compared to conventional static RAM cells, which may typically comprise six transistors. In the embodiment shown, the memory cell 250 may comprise a first double channel transistor 200N in the form of an N-type transistor, i.e., drain and source regions 204D, 204S thereof, may be doped by an N-type dopant species, as is also previously explained with reference to the double channel transistor 100 of FIG. 1a. Furthermore, a second double channel transistor 200P may be provided in the form of a P-type transistor, that is, corresponding drain and source regions 204D, 204S may be doped with a P-type dopant species. Furthermore, the transistors 200N, 200P are electrically connected to each other such that each gate electrode 205 is connected to the corresponding source region 204S, wherein both source regions 204S are also connected to corresponding body regions 208 of each of the transistors 200N, 200P. Furthermore, as illustrated, a highly conductive connection may be established between the gate electrodes 205. Furthermore, a node 208A is thus connected to the body regions 208, the source regions 204S and the gate electrode structures 205 of both transistors 200N, 200P so that the node 208A may act as an input and an output of an information storing element formed by the two double channel transistors 200N, 200P. That is, when applying an appropriate operating voltage $V_{DD}$, $V_{SS}$ via the drain 204D of the N-type transistor 200N and the drain 204D of the P-type transistor 200P, application of an appropriate input voltage at the node 208A may result in a stable state of the transistors 200N, 200P, which may then also be "read out" at the node 208A on the basis of an appropriate sensing circuit, as is well known in the art. Furthermore, the memory cell 250 may comprise a select transistor 200S, a gate 205 of which is connected to a select line, while the drain/source path of the transistor 200S may represent a switchable conductive path so as to controllably connect the node 208A to a bit line. With respect to space efficiency, the select transistor 200S may be provided in the form of a "single" channel transistor without requiring a specific body contact, such as the contacts 208 of the double channel transistors 200N, 200P.

As previously explained, when using conventional body contact technologies for implementing the circuitry of FIG. 2a as an actual layout or semiconductor device, a significant silicon consumption may be associated with the actual configuration of the double channel transistors 200N, 200P, as is previously explained with reference to FIG. 1c. According to the principles disclosed herein, however, the interconnect structure for the transistors 200N, 200p may be based on a space-efficient body contact structure, thereby reducing the overall area consumption of the static memory cell 250, which may be significantly less compared to conventional single channel transistor or double channel transistor configurations.

Figure 2B:
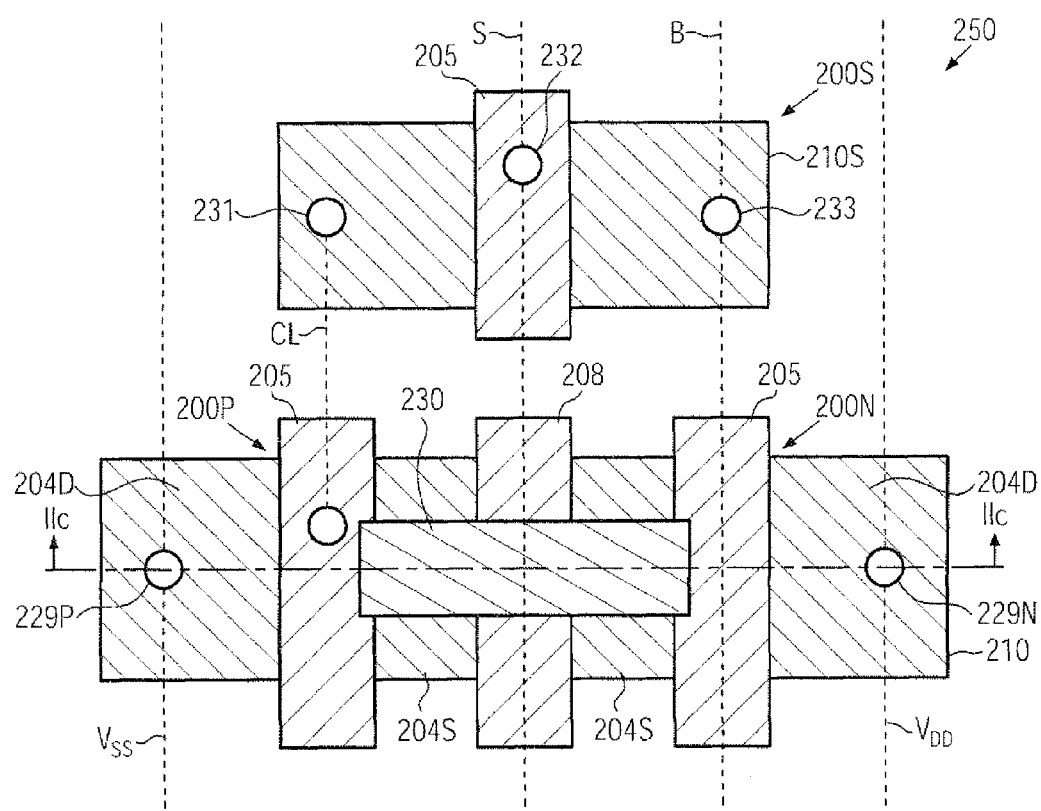
FIG. 2b schematically illustrates a top view of a semiconductor device or a layout thereof, in which the electrical circuit of FIG. 2a is implemented, thereby forming a static RAM cell on the basis of a space-efficient layout or configuration, according to illustrative embodiments.

FIG. 2b schematically illustrates a top view of the static memory cell 250 in an actual implementation, or FIG. 2b may be considered as a layout of the memory cell 250. A layout is to be understood as the geometrical configuration of the various device levels required for implementing the memory cell 250 in an actual semiconductor chip, wherein the geometrical configuration may be provided in the form of any appropriate means, such as a computer program, hard copies and the like, as may typically be used in designing actual semiconductor devices. As illustrated, the layout or the actual semiconductor device corresponding to the static memory cell 250 may comprise the two double channel transistors 200N and 200P, which, in one illustrative embodiment, may be formed in a single active region 210. That is, the active region 210, which may represent a corresponding semiconductor area, such as a silicon-based semiconductor material, may be enclosed by an isolation structure (not shown in FIG. 2b) without any internal isolation structures that may divide the active region 210 into individual sub-regions isolated from each other. In this embodiment, the N-type channel transistor 200N may comprise the drain region 204D and the source region 204S formed within the active region 210, wherein the source region 204S may connect to a "body" region provided within the active region 210 below a body contact 208, which may be formed above the active region 210 and which, in one illustrative embodiment, may have a similar configuration as the corresponding gate electrodes 205 of the transistors 200N, 200P. That is, the gate electrodes 205 and the body contact 208 may be formed on the basis of a common manufacturing sequence up to a certain manufacturing stage, thereby providing a high degree of compatibility and efficiency, as will be described later on in more detail. Furthermore, the body contact 208 may define a conductive path (not shown) extending into the active region 210 so as to connect to the semiconductor region formed therein, which in turn may connect to the body regions of the transistors 200N, 200P, as will also be described later on in more detail. Similarly, the P-type double channel transistor 200P may comprise a drain region 204D and the source region 204S formed in the same active region 210, however established on the basis of a dopant species providing the opposite conductivity type compared to the drain and source regions of the double channel transistor 200N. Furthermore, a contact element 229N may connect the drain region 204D of the transistor 200N with a metallization layer and finally with a metal line connected to the supply voltage $V_{DD}$. Similarly, a contact element 229P may connect the drain region 204D of the transistor 200P with the metallization system and thus finally with the supply voltage $V_{SS}$ according to the circuit configuration as shown in FIG. 2a. Moreover, a contact element 230 provided in the form of a rectangular contact may connect the gate electrodes 205 of the transistors 200N, 200P with the corresponding source regions 204S and also with the body contact 208. Thus, by means of the contact element 230 and the body contact 208, which is laterally positioned between the transistors 200N, 200P, i.e., the corresponding gate electrodes 205 thereof, a highly spaced efficient interconnect regime may be provided so as to obtain the electric configuration as shown in FIG. 2a.

Furthermore, the memory cell 250, i.e., the layout thereof or the actual implementation in a semiconductor material in the form of a semiconductor device, may comprise the select transistor 200S, which may be formed in and above a separate active region 210S, which may be positioned with respect to the active region 210 so as to provide a space-efficient overall configuration while also enabling an efficient electrical connection to the transistors 200N, 200P and to other memory cells (not shown) via corresponding select and bit lines S, B, respectively. In one illustrative embodiment, the select transistor 200S may be provided in the form of a single channel transistor with its gate electrode 205 substantially aligned to the body contact 208, thereby providing a space-efficient overall configuration. It should be appreciated, however, that the select transistor 200S may be positioned according to other spatial relationships with respect to the body contact 208 and the transistors 200N, 200P, depending on the overall geometric configuration of a semiconductor device including a plurality of the memory cells 250. For connecting the select transistor 200S, corresponding contact elements 231, 232 and 233 may be provided, wherein the contact elements 232, 233 may connect the gate electrode 205 and one of a drain or source region with the select line and the bit line, respectively. Similarly, the contact element 231 may provide a connection to the metallization system, which in turn may be connected to one of the gate electrodes 205 or the contact element 230, as indicated by the line CL, depending on the overall configuration.

Figure 2C:
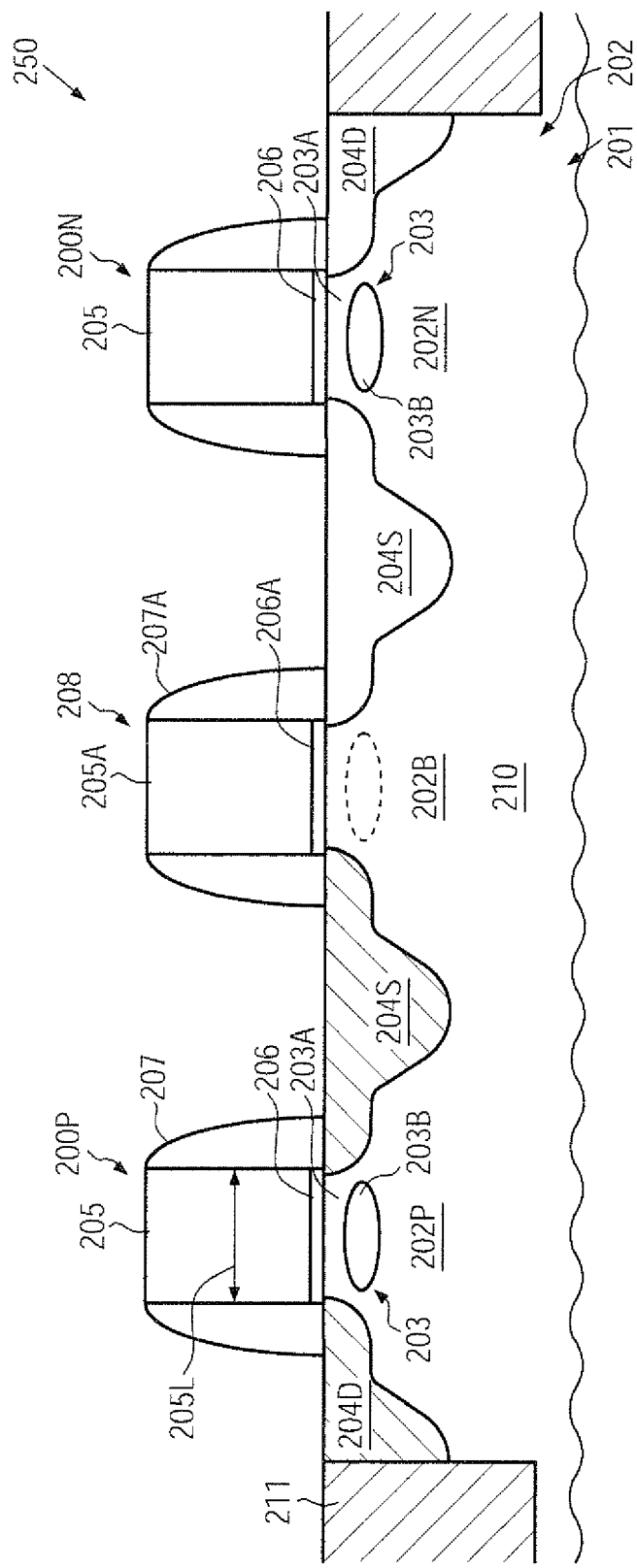
FIGS. 2c-2g schematically illustrate cross-sectional views of a portion of the semiconductor device as shown in FIG. 2c during various manufacturing stages, according to still further illustrative embodiments.

FIG. 2c schematically illustrates a cross-sectional view along the section 11c of FIG. 2b at a specific manufacturing stage in which the basic transistor configurations may be substantially completed. It should be appreciated that the select transistor 200S (FIG. 2b) may also be in a corresponding manufacturing stage. As illustrated, the semiconductor device 250 may comprise a substrate 201 which may represent any appropriate carrier material for forming thereabove a semiconductor layer 202. For example, the substrate 201 may represent a semiconductor substrate, an insulating material and the like wherein also, if required, a buried insulating material (not shown) may be formed so as to define an SOI configuration, at least locally within the substrate 201. Furthermore, an isolation structure 211 may be formed in the semiconductor layer 202 so as to laterally enclose and thus define the active region 210, which, in the embodiment shown, may represent a continuous semiconductor region without any intermediate isolation structures. It should be appreciated, however, that, in other cases, a narrow isolation structure may be provided if desired, for instance below the body contact 208, as long as a conductive path may be established to corresponding sub-areas of the active region 210. Moreover, in the manufacturing stage shown, the transistors 200N, 200P may comprise the gate electrodes 205, which may be formed on corresponding gate insulation layers 206 having an appropriate thickness and material composition depending on the overall technology standard used for forming the device 250. Furthermore, sidewall spacer structures 207 may be formed on sidewalls of the gate electrodes 205.

For this purpose, a silicon nitride material may be used, possibly in combination with an appropriate etch stop liner (not shown). It should further be appreciated that the spacer structures 207 may comprise two or more individual spacer elements, depending on the complexity of the dopant profile within the active region 210.

In the embodiment shown, the body contact 208 may have a similar configuration or a substantially identical configuration as the gate electrodes 205. That is, the body contact 208 may comprise a gate electrode 205A, which may also be referred to as a dummy gate electrode, since the electrode structure 205A may not be used to control a corresponding conductive channel but may be used to establish a conductive path into the active region 210 so as to act as a body contact in a later manufacturing stage. Furthermore, a "gate insulation layer" 206A may be provided, thereby separating the electrodes 205A from the active region 210 in this manufacturing stage. Similarly, a spacer structure 207A may be formed on sidewalls of the electrode 205A. In some illustrative embodiments, the corresponding lengths of the gate electrodes 205 and of the electrode 205A, as indicated by 205L, may be based on the same design target value, which may depend on the technology standard under consideration. In other cases, the body contact 208, i.e., the electrode 205A thereof, may have an increased length, if required, for instance with respect to adapting overall electrical performance when providing an isolation region below the body contact 208 and the like. In view of a highly space-efficient configuration, it may be advantageous to provide the gate electrodes 205 and the electrode 205A on the basis of the same geometrical parameters.

Furthermore, as illustrated, the respective drain and source regions 204S, 204D may be established within the active region 210, which may be based on different dopant species so as to define the corresponding conductivity type of the transistors 200N, 200P. Furthermore, respective body regions 202P, 202N may also have a corresponding base doping so as to provide the required transistor characteristics. Furthermore, the transistors 200N, 200P may comprise a "double channel" region 203 having a first channel 203A and a second channel 203B of opposite doping compared to the first channel region 203A, as is also explained with reference to the transistor 100 of FIG. 1a. It should be appreciated that the dopant of the channel region 203 of the P-channel transistor 200P may be opposite to the doping of the channel region 203 of the N-channel transistor 200N. It should be appreciated that, in the context of the present application, a double channel transistor is to be considered as a field effect transistor including a channel region having a first channel region 203A formed adjacent to the corresponding gate insulation layer, such as the layer 206, which may have the same conductivity type as the corresponding body region, such as the region 202N for the transistor 200N and the region 202P for the transistor 200P, while a second channel region 203B is also provided below the first channel region, having an inverse conductivity type compared to the first channel region.

The semiconductor device 250 as shown in FIG. 2c may be formed on the basis of the layout concept as also illustrated with reference to FIG. 2b on the basis of well-established process techniques, as are, for instance, described with reference to FIG. 1a, wherein, however, the base doping of the transistors 200N, 200P may be added within the active region 210, which may be accomplished by appropriate masking regimes prior to forming the gate electrode structures 205. Thereafter, the gate electrodes 205 and the dummy gate electrode 205A may be formed in accordance with process techniques as previously described, wherein, if required, the structure 205A may be formed on the basis of the same critical dimensions as the gate electrodes 205. Thus, by providing the dummy gate electrode 205A, at least a portion of the active region 210, as indicated by 202B, may be blocked during any subsequent implantation processes for establishing the drain and source regions 204S, 204D for the transistors 200N, 200P. It should be appreciated that the "body region" 202B may comprise regions of different basic doping, which may be generated during the previous implantation processes for providing the basic dopant concentrations and channel dopings for the transistors 200N, 200P of different conductivity type.

Based on the spacer structure 207, an appropriate dopant profile for the corresponding drain and source regions 204D, 204S may be established and, thereafter, the respective anneal processes may be performed in accordance with overall process and device requirements.

Figure 2D:
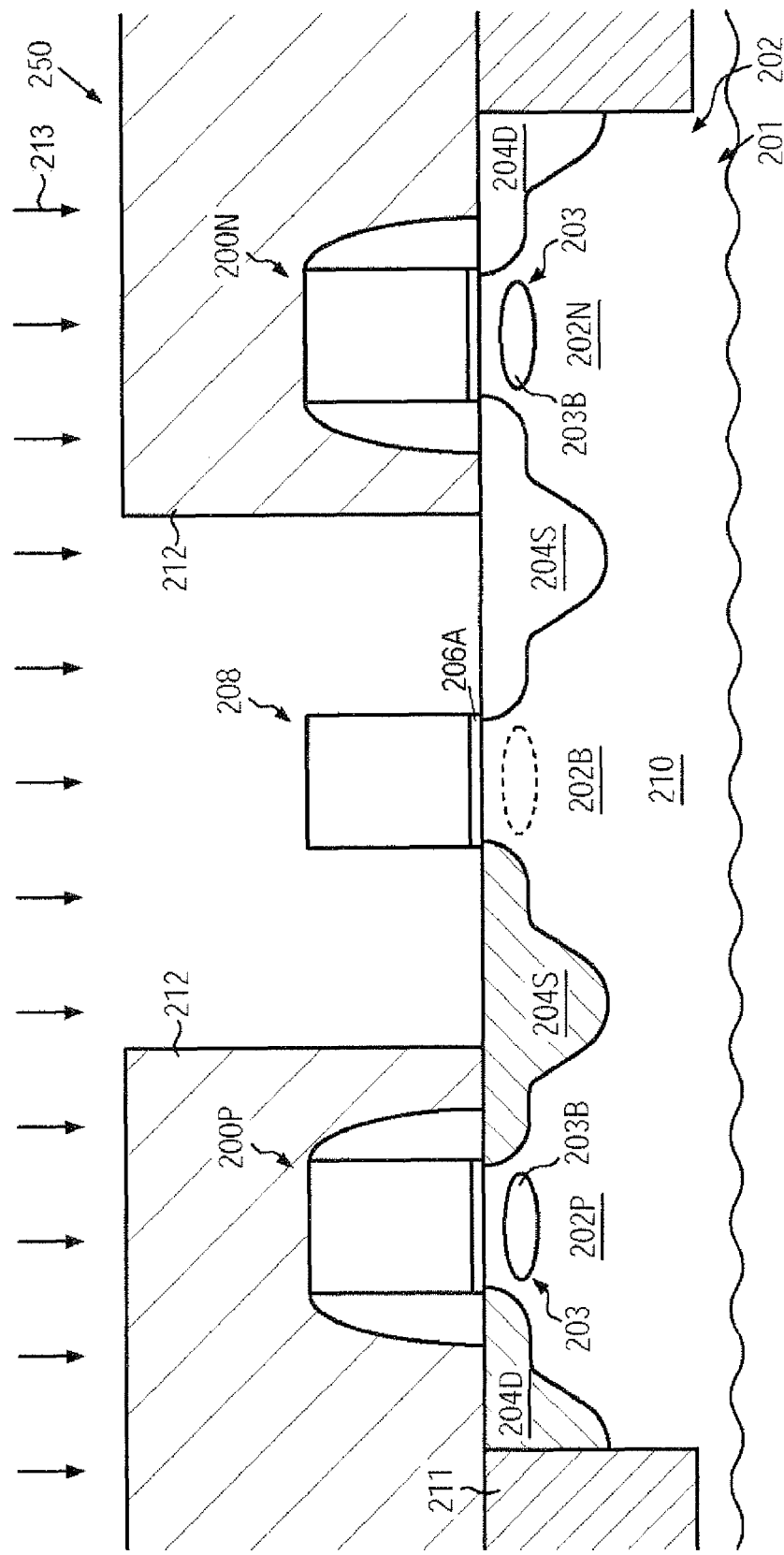

FIG. 2d schematically illustrates the semiconductor device 250 in an advanced manufacturing stage, in which an etch mask 212 may be provided, for instance in the form of a resist mask, which may cover the transistors 200P, 200N while exposing the body contact 208. The etch mask 212 may be formed in accordance with established photolithography techniques based on a correspondingly designed photomask. Thereafter, the device 250 may be exposed to an etch ambient 213 designed to remove the spacer structure 207A (FIG. 2c) of the body contact 208. For this purpose, well-established plasma-based and/or wet chemical etch recipes are available. For example, silicon nitride material may be efficiently removed selectively to silicon dioxide, silicon and the like on the basis of plasma assisted etch recipes and also by wet chemical techniques using hot phosphoric acid. If required, a corresponding etch stop liner, such as a silicon dioxide material, may also be removed when provided. During the corresponding etch process, a certain degree of under-etching of the "gate insulation layer" 206A may occur and may even be advantageous for establishing a conductive path to the body region 202B in a later manufacturing stage.

Figure 2E:
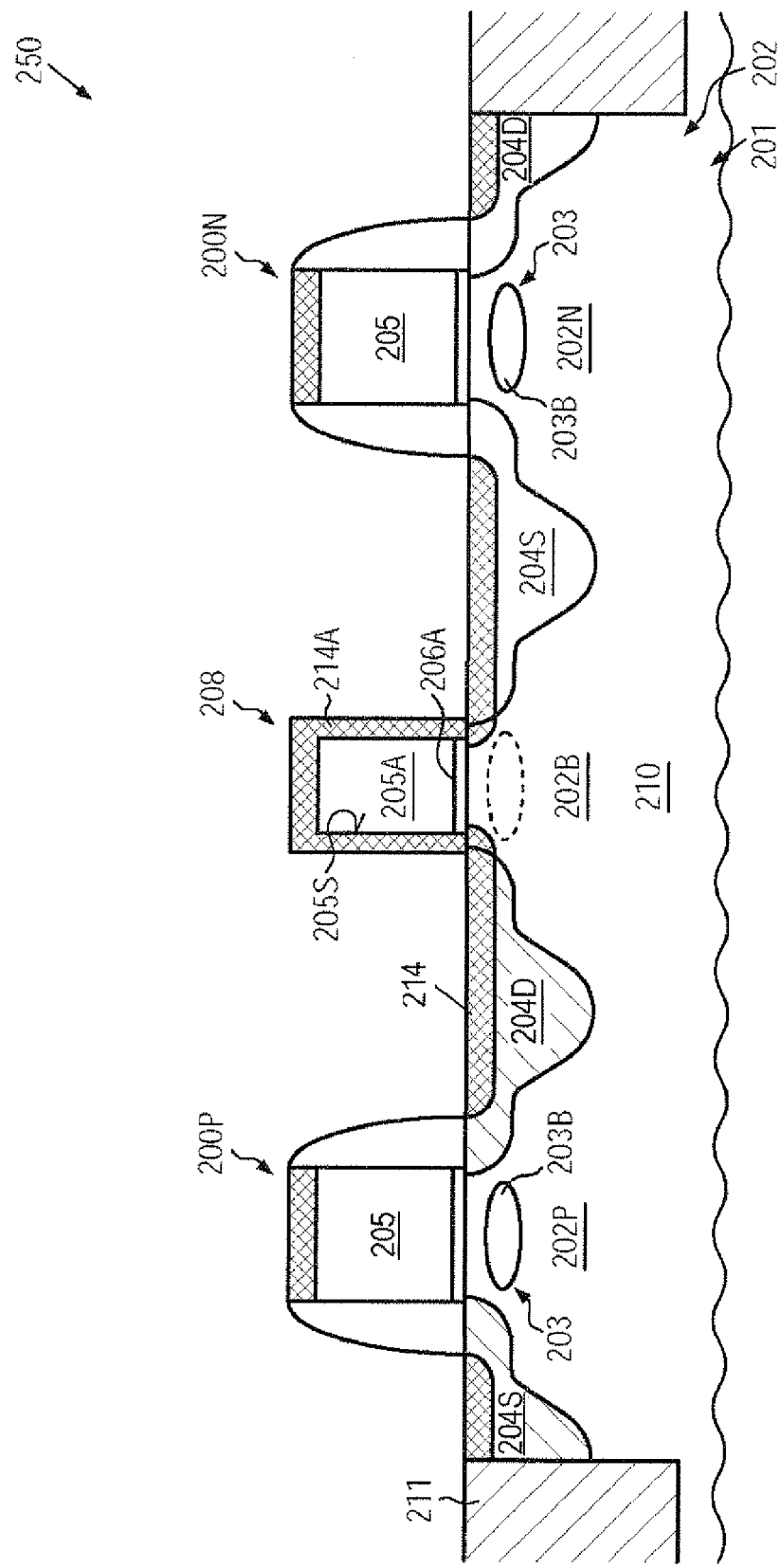

FIG. 2e schematically illustrates the semiconductor device 250 in a further advanced manufacturing stage, in which metal silicide regions are formed on exposed silicon areas. That is, metal silicide regions 214 may be formed in and on the drain and source regions 204D, 204S of the double channel transistors 200N, 200P and also in and on the gate electrodes 205. Due to the previous exposure of the sidewalls of the dummy gate electrode 205A, a corresponding metal silicide 214A may also be formed on the electrode 205A and on the corresponding exposed sidewall portions 205S, wherein metal silicide material may also extend into the body region 202B, caused by the silicidation of the surface areas of the adjacent source regions 204S of the transistors 200N, 200P and also caused by the exposure of the surfaces 204S. The effect may even be enhanced by providing a certain degree of under-etching of the dielectric layer 206A, as is also previously discussed with reference to FIG. 2d. Consequently, a highly conductive path is created from the electrode 205A into the body region 202B. It should be appreciated that, even if a pronounced transition area between differently doped areas may have been created in the body region 202B, for instance at an initial phase when defining the basic transistor characteristics in the active region 210, as previously explained, nevertheless a conductive path may be created into each of the corresponding areas of different doping so that the electrode 205A may electrically connect to each of the body regions 202N, 202P.

The metal silicide regions 214, 214A may be formed on the basis of well-established process techniques which may include the deposition of a refractory metal, such as nickel, platinum, cobalt, titanium and the like, with a subsequent heat treatment for initiating a corresponding chemical reaction with silicon material. Thereafter, any non-reacted metal may be removed on the basis of well-established selective etch recipes and, thereafter, if required, further heat treatments may be performed to stabilize the metal silicide material and/or provide the desired electrical characteristics thereof.

Figure 2F:
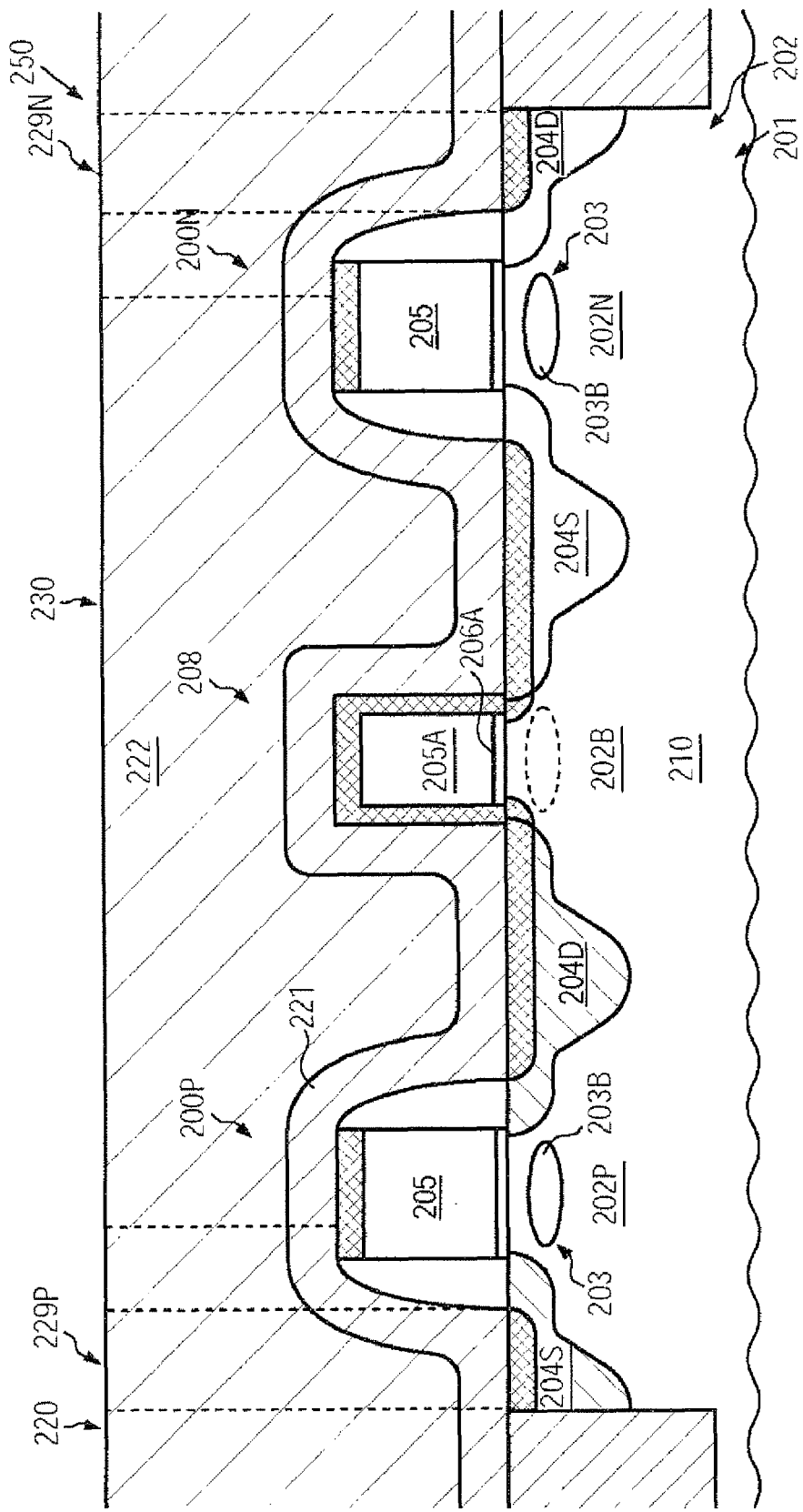

FIG. 2f schematically illustrates the device 250 in a further advanced manufacturing stage. As illustrated, a contact level 220 may be provided above the transistors 200N, 200P and the body contact 208. The contact level 220 may represent an appropriate contact structure for providing contact elements that may connect to the circuit elements formed in and above the semiconductor layer 202, i.e., the active region 210, and to a metallization system still to be formed above the contact level 220. As illustrated, the contact level 220 may comprise an etch stop material 221, which may be provided in the form of silicon nitride, nitrogen-containing silicon carbide and the like, depending on the overall process and device requirements, followed by an interlayer dielectric material 222, such as silicon dioxide and the like. It should be appreciated that the specific configuration of the contact level 220 may depend on the overall technology standard under consideration and may thus differ with respect to materials and dimensions. The materials 221 and 222 may be formed on the basis of well-established process techniques, such as the deposition of a silicon nitride material or any other appropriate etch stop material, for instance using plasma enhanced chemical vapor deposition (CVD) processes, followed by the deposition of the interlayer dielectric material 222, for which well-established techniques, such as plasma enhanced CVD, sub-atmospheric CVD and the like, may be used. If required, the resulting surface topography may be planarized by performing a chemical mechanical polishing (CMP) process in order to provide a substantially planar surface prior to patterning the contact level 220 to form respective contact elements, such as the contact elements 229N, 229P and 230, as indicated by the dashed lines. Thus, by providing the contact 230, a highly conductive connection may be established between the body region 202B, the source regions 204S and the gate electrodes 205 of the transistors 200N, 200P. Thus, during the patterning of the contact level 220, an appropriate etch mask may be provided to define the lateral size and the position of corresponding openings for the contact elements 229N, 229P and 230 and, of course, for other contact elements, for instance connecting to the select transistor 200S (FIG. 2b). Thereafter, the interlayer dielectric material 222 may be patterned, for instance, using the layer 221 as an etch stop, which may subsequently be opened by a further etch step to obtain the desired openings. Next, an appropriate conductive material, such as tungsten and the like, possibly in combination with an appropriate barrier material, may be filled into the corresponding openings and any excess material may be removed, for instance on the basis of CMP and the like.

Figure 2G:
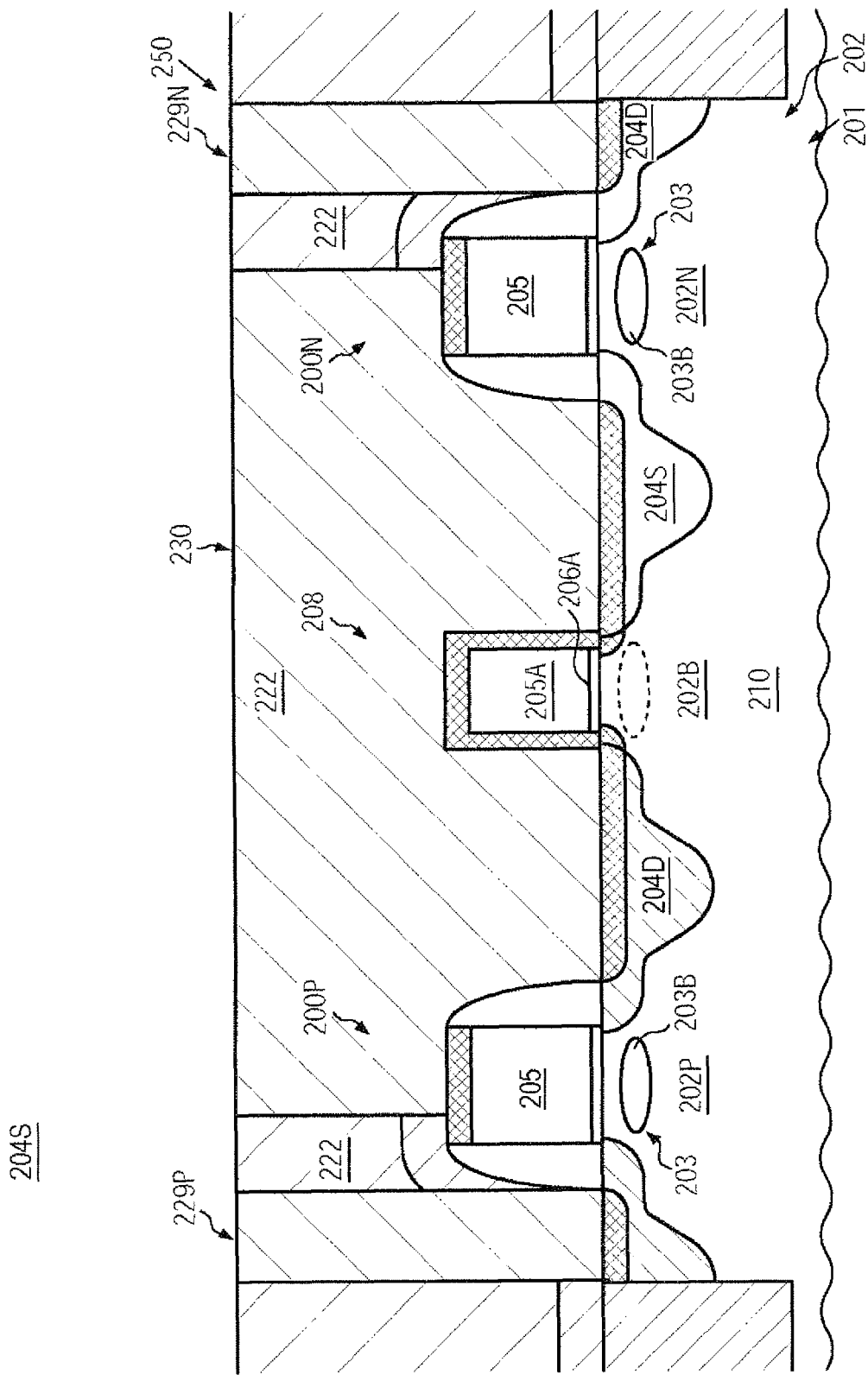

FIG. 2g schematically illustrates the device 250 after the above-described process sequence. Hence, the contact elements 229N, 229P connect to the corresponding drain regions 204D of the transistors 200N, 200P, respectively, while the contact element 230 in the form of a single continuous contact element connects the body contact 208 with the gate electrode structures 205 and the corresponding source regions 204S, as previously explained. Based on the configuration as shown in FIG. 2g, the further processing may be continued by providing one or more metallization layers on the basis of well-established manufacturing techniques. Thus, during the formation of the metallization system, corresponding metal lines may be established, such as metal lines for connecting to the supply voltages $V_{DD}$, $V_{SS}$ (FIG. 2b) and also establishing an electrical connection from the contact element 230 to the select transistor 200S (FIG. 2b), for instance, on the basis of the contact element 231, as explained with reference to FIG. 2b. Similarly, the select line and the bit line S, B may be established on the basis of the corresponding contact elements 232, 233 as is also described with reference to FIG. 2b during the formation of the corresponding metallization system. For convenience, any such metallization structures are not shown in FIG. 2g.

Thus, based on a highly efficient overall manufacturing flow, the electrical connections required in accordance with the circuit layout as shown in FIG. 2a may be established without unduly contributing to overall complexity, while nevertheless providing a very space-efficient circuit configuration on the basis of the body contact 208, for instance in the form of the dummy gate electrode 205A and the "rectangular" contact element 230. Hence, the device 250 may be provided in the form of a very space-efficient static RAM cell according to the layout or configuration as shown in FIG. 2b, wherein a high degree of compatibility with conventional manufacturing techniques may be maintained, except for a selective removal of the spacer structure 207A (FIG. 2d) in order to establish the highly conductive path between the electrode 205A and the body region 202B.

It should be appreciated that the conductive path for the body contact 208 connecting to the corresponding body regions 202N, 202P may provide sufficient conductivity, since a depletion region which may be expected to exist between the silicon body located under the corresponding gate electrodes 205 and the bodies 202P, 202N themselves may be prevented since, according to the circuit diagram as shown in FIG. 2a, the body contact 208 and the source electrodes of the transistors 200N, 200P are connected with each other and are maintained at the same electrical level, so that a depletion region below the source regions may be avoided and the body contact 208 provides an efficient conductive path.

As a result, the present disclosure provides methods and semiconductor devices in which double channel transistors may be formed in a space-efficient manner by providing a body contact that is laterally positioned therebetween, while a single contact element may provide the concurrent electrical connection of the source regions, the gate electrodes and the body contact. Thus, in one illustrative embodiment, a static RAM cell may be provided on the basis of a P-type and an N-type double channel transistor in combination with a select transistor, for instance in the form of a single channel transistor, wherein the overall area consumption may be significantly less compared to conventional static RAM cells.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
   forming a body contact above an active region and laterally between a first double channel transistor and a second double channel transistor;

forming an interlayer dielectric material above said body contact and said first and second double channel transistors; and forming a contact element in said interlayer dielectric material so as to connect to a first gate electrode and a source region of said first double channel transistor, a second gate electrode and a source region of said second double channel transistor and said body contact.

2. The method of claim 1, wherein said body contact and said first and second gate electrodes are formed in a common manufacturing sequence.

3. The method of claim 1, wherein forming said body contact comprises exposing sidewall portions of an electrode structure of said body contact and forming a metal silicide on said exposed sidewalls.

4. The method of claim 1, wherein said first and second double channel transistors are formed in and on said active region.

5. The method of claim 1, further comprising forming a select transistor in and above a second active region, wherein said first and second double channel transistors and said select transistor are connected to form a static RAM cell.

6. The method of claim 5, wherein a gate electrode of said select transistor is aligned with its width direction to a width direction of said body contact.

* * * * *